(12) United States Patent
Reznicek et al.

(10) Patent No.: US 10,777,464 B2
(45) Date of Patent: Sep. 15, 2020

(54) LOW THERMAL BUDGET TOP SOURCE AND DRAIN REGION FORMATION FOR VERTICAL TRANSISTORS

(71) Applicant: INTERNATIONAL BUSINESS MACHINES CORPORATION, Armonk, NY (US)

(72) Inventors: Alexander Reznicek, Troy, NY (US); Shogo Mochizuki, Clifton Park, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/668,590

(22) Filed: Oct. 30, 2019

(65) Prior Publication Data

US 2020/0066594 A1    Feb. 27, 2020

Related U.S. Application Data

(62) Division of application No. 15/894,208, filed on Feb. 12, 2018, now Pat. No. 10,651,089.

(51) Int. Cl.
*H01L 21/8234* (2006.01)
*H01L 21/02* (2006.01)
(Continued)

(52) U.S. Cl.
CPC ........... *H01L 21/823425* (2013.01); *H01L 21/02532* (2013.01); *H01L 21/02592* (2013.01); *H01L 21/02631* (2013.01); *H01L 21/02658* (2013.01); *H01L 21/02667* (2013.01); *H01L 21/26513* (2013.01); *H01L 21/823418* (2013.01); *H01L 21/823487* (2013.01); *H01L 27/088* (2013.01); *H01L 29/66666* (2013.01)

(58) Field of Classification Search
CPC ....... H01L 21/823425; H01L 21/02532; H01L 21/02592; H01L 21/02631; H01L 21/02658; H01L 21/02667; H01L 21/26513; H01L 21/823487
USPC ........................................................ 257/66
See application file for complete search history.

(56) References Cited

U.S. PATENT DOCUMENTS 5,365,097 A    11/1994 Kenney
5,641,694 A     6/1997 Kenney
(Continued)

OTHER PUBLICATIONS

List of IBM Patents or Patent Applications Treated as Related dated Oct. 30, 2019, 2 pages.
(Continued)

*Primary Examiner* — Elias Ullah
(74) *Attorney, Agent, or Firm* — Tutunjian & Bitetto, P.C.; Vazken Alexanian

(57) ABSTRACT

A method of forming a semiconductor device that includes forming a vertically orientated channel in a semiconductor fin structure that is present on a supporting substrate; and depositing a doped amorphous semiconductor material on an upper surface of the semiconductor fin structure that is opposite a base surface of the semiconductor fin structure that is in contact with the supporting substrate. The method further includes recrystallizing the doped amorphous semiconductor material with an anneal duration for substantially a millisecond duration or less to provide a doped polycrystalline source and/or drain region at the upper surface of the semiconductor fin structure.

20 Claims, 9 Drawing Sheets

(51) Int. Cl.
*H01L 21/265* (2006.01)
*H01L 27/088* (2006.01)
*H01L 29/66* (2006.01)

(56) References Cited

U.S. PATENT DOCUMENTS

| | | |
|---|---|---|
| 6,720,216 B2 | 4/2004 | Forbes |
| 7,365,385 B2 | 4/2008 | Abbott |
| 8,466,511 B2 | 6/2013 | Oh et al. |
| 9,466,723 B1 | 10/2016 | Huang et al. |
| 9,530,866 B1 | 12/2016 | Zhang et al. |
| 9,640,636 B1 | 5/2017 | Bently et al. |
| 9,768,085 B1 | 9/2017 | Cheng et al. |

OTHER PUBLICATIONS

Mitani, Y. et al., "Buried Source and Drain (BSD) Structure for Ultra-shallow Junction Using Selective Deposition of Highly Doped Amorphous Silicon" 1996 Symposium on VLSI Technology Digest of Technical Papers (Jun. 1996) pp. 176-177.

Yakimets, D. et al., "Vertical GAAFETs for the Ultimate CMOS Scaling" IEEE Transactions on Electron Devices (May 2015) pp. 1433-1439, vol. 62, No. 5.

LOW THERMAL BUDGET TOP SOURCE AND DRAIN REGION FORMATION FOR VERTICAL TRANSISTORS

BACKGROUND

Technical Field

The present invention generally relates to vertically orientated semiconductor devices, and more particularly to vertical transport field effect transistors (VTFETs).

Description of the Related Art

The dimensions of semiconductor field effect transistors (FETs) have been steadily shrinking, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance and circuit density improvements. One such class of device is a vertical transport field effect transistor (VTFET).

SUMMARY

In one embodiment, a method of forming a semiconductor device is provided that includes forming a vertically orientated channel in a semiconductor fin structure that is present on a supporting substrate, and depositing a doped amorphous semiconductor material on an upper surface of the semiconductor fin structure that is opposite a base surface of the semiconductor fin structure that is in contact with the supporting substrate. The method further includes recrystallizing the doped amorphous semiconductor material with an anneal duration for substantially a millisecond duration or less to provide a doped polycrystalline source and/or drain region at the upper surface of the semiconductor fin structure.

In another embodiment, the method comprises forming a semiconductor device is provided that includes forming a plurality of vertically orientated channel regions each present in a semiconductor fin structure that is present on a supporting substrate, wherein an epitaxial source and/or drain region is present at the base of each of the plurality of vertically orientated channel regions. The method may continue with depositing a doped amorphous semiconductor material on an upper surface of each of said semiconductor fin structure for the plurality of vertically orientated channel regions that are opposite a base surface of the semiconductor fin structure that is in contact with the supporting substrate. The method further includes recrystallizing the doped amorphous semiconductor material with an anneal temperature ranging from 600° to 1250° C. for a millisecond or less duration to provide a doped polycrystalline source and/or drain region at the upper surface of the semiconductor fin structure, wherein the doped polycrystalline source and/or drain region has a planar upper surface and provides a merging structure between adjacent fin structures that provide the plurality of vertically orientated channel regions.

In another aspect, a semiconductor device is provided. The semiconductor device comprises a vertically orientated channel region present within a fin structure having a base end in contact with a supporting substrate. An epitaxial semiconductor material present at the base end of the fin structure provides a first source/drain region. A recrystallized polycrystalline semiconductor material having a planar upper surface that is present on an upper end of the fin structure that is opposite the base end of the fin structure provides a second source/drain region. In some embodiments, the recrystallized polycrystalline semiconductor material is doped with an n-type dopant, such as antimony (Sb). In some embodiments, the recrystallized polycrystalline semiconductor material is doped with a p-type dopant, such as gallium (Ga).

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
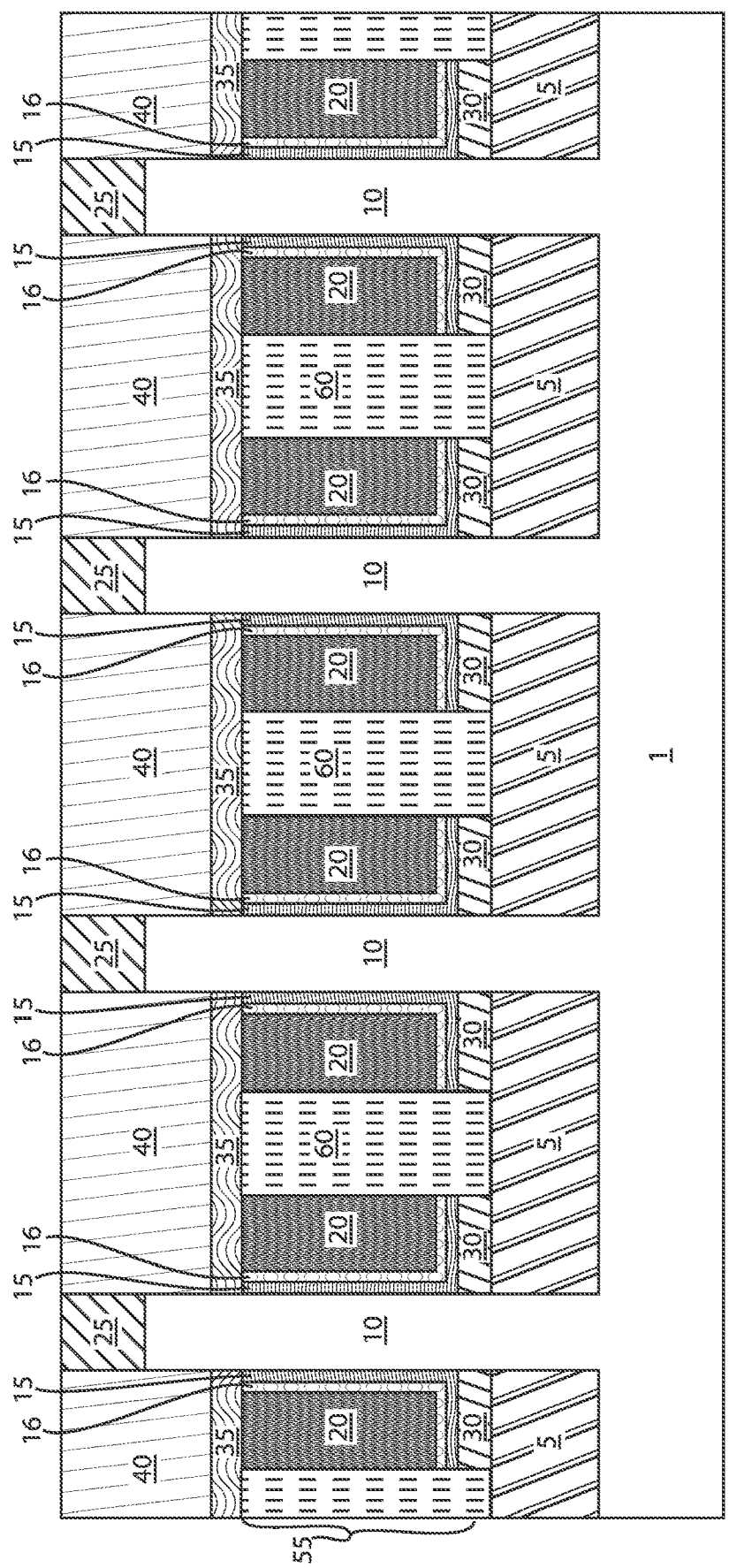
FIG. 1A is a side cross-sectional view depicting a first embodiment of a plurality of partial vertical field effect device structure for use as an initial structure for forming a doped recrystallized source/drain region, in which the fin structure is subtractively formed from a bulk semiconductor substrate.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a VTFET. A field effect transistor (FET) is a semiconductor device in which output current, i.e., source-drain current, is controlled by the voltage applied to a gate structure to the semiconductor device. The vertical transport field effect transistors (VFETs) provided by the present disclosure employ a fin structure to contain the channel region of the device. An upper source/drain region is present on the uppermost, i.e., top surface, of the fin structure. The bottom source/drain region is not part of the fin structure, but is present within a layer that is supporting the fin structure. The flow of carriers from the source region to the drain region across the channel region that is present in the fin structure is perpendicular to the plane provided by the upper surface of the underlying supporting substrate. Hence, the device is vertically orientated.

It has been determined that forming epitaxial semiconductor materials for vertical transistors can be challenging. Selective epitaxial deposition can be at optimum conditions when the temperature is above 550° C. due to the effectiveness of the hydrogen chloride (HCl) in in-situ etching. It has been determined that at temperatures less than 550° C., hydrogen chloride (HCl) looses its effectiveness as an etchant. In some instances, at low temperatures, e.g., low temperatures ranging from 550° C. to 625° C., slow epitaxial growth rates are observed in selective recipes due to the effectiveness of the hydrogen chloride (HCl) as an etchant. Deposition times of 30 minutes to 60 minutes per wafer are not uncommon in these conditions, which results in a costly and uneconomical process.

Due to its high temperature of above about 550° C., such selective epitaxial processes are not suitable for forming top source/drain regions of a vertical transistor. Because forming source/drain regions occurs after forming transistor gates, the thermal budget for source/drain and contact processes is constrained by the stability of gate materials, often expressed as a maximum allowable transistor threshold voltage shift of several tens of millivolts or a maximum allowable gate dielectric re-growth or thickening of a quarter of Angstrom or less. High temperatures of higher than 450° C. and long exposure times are detrimental to the gate stack. Instead, a low-temperature nonselective processes, such as depositing amorphous semiconductor material are used. CVD based processes can be conducted at temperatures of from 150° C. to 450° C. while PVD based processes can be conducted at temperatures of from 20° C. (room temperature) to 350° C. Typical deposition duration will be several minutes and exposure of wafers to temperatures at or below 450° C. for minutes does not adversely affect the temperature-sensitive gate stack.

In some embodiments, the method and structures described herein provide for a top, i.e., upper, source/drain region formation on vertical transistor structures, i.e., fin type geometry channel regions, with a lower thermal budget. The thermal budget employed in the methods described herein is substantially low enough to avoid reducing the integrity of the gate stack, shifting transistor threshold voltages by more than 30 millivolts, or thickening gate dielectric by more than 0.25 Angstrom. The reduced thermal budget results from the application of amorphous semiconductor material deposition at low substrate temperature followed with laser annealing, or other like high temperature but low duration annealing process. For example, the annealing processes used in the methods described herein may have a millisecond duration, i.e., be a millisecond anneal, at a temperature range that ranges from 700° C. to 1200° C. using laser annealing and/or flash annealing. In another example, the annealing processes used in the methods described herein may have a nanosecond duration (e.g. from about 20 nanoseconds to about 1000 nanoseconds), i.e., be a nanosecond laser melt anneal, at a temperature exceeding the melt point of amorphous germanium ($\alpha$-Ge) or exceeding the melt point of amorphous silicon germanium ($\alpha$-SiGe) at a temperature ranging from 700° C. to 1225° C. This is in comparison to conventional annealing and deposition processes that employ a duration ranging from 1 minute to 60 minutes and a temperature range that ranges from 550° C. to 650° C. for deposition processes and a duration of from 1 second to 60 seconds and a temperature range that ranges from 900° C. to 1050° C. for annealing processes.

In some embodiments, the aforementioned process conditions allow for easier incorporation of contact resistance improving dopants like gallium (Ga) and/or antimony (Sb), which can be difficult dopants to implement in in situ doping processes. Additionally, the methods and structures described herein can increase the contact area to the top, i.e., upper, source/drain region, which further reduced contact resistance. The increased contact area results from a large flat semiconductor surface that results from the aforementioned processing of amorphous semiconductor materials, which has a greater surface area for being contacted when compared to the facetted, i.e., peaked, upper surface of diamond shaped epitaxial material. Further details of the methods and structures of the present disclosure are now provided with reference to FIGS. 1A-8.

Figure 1B:
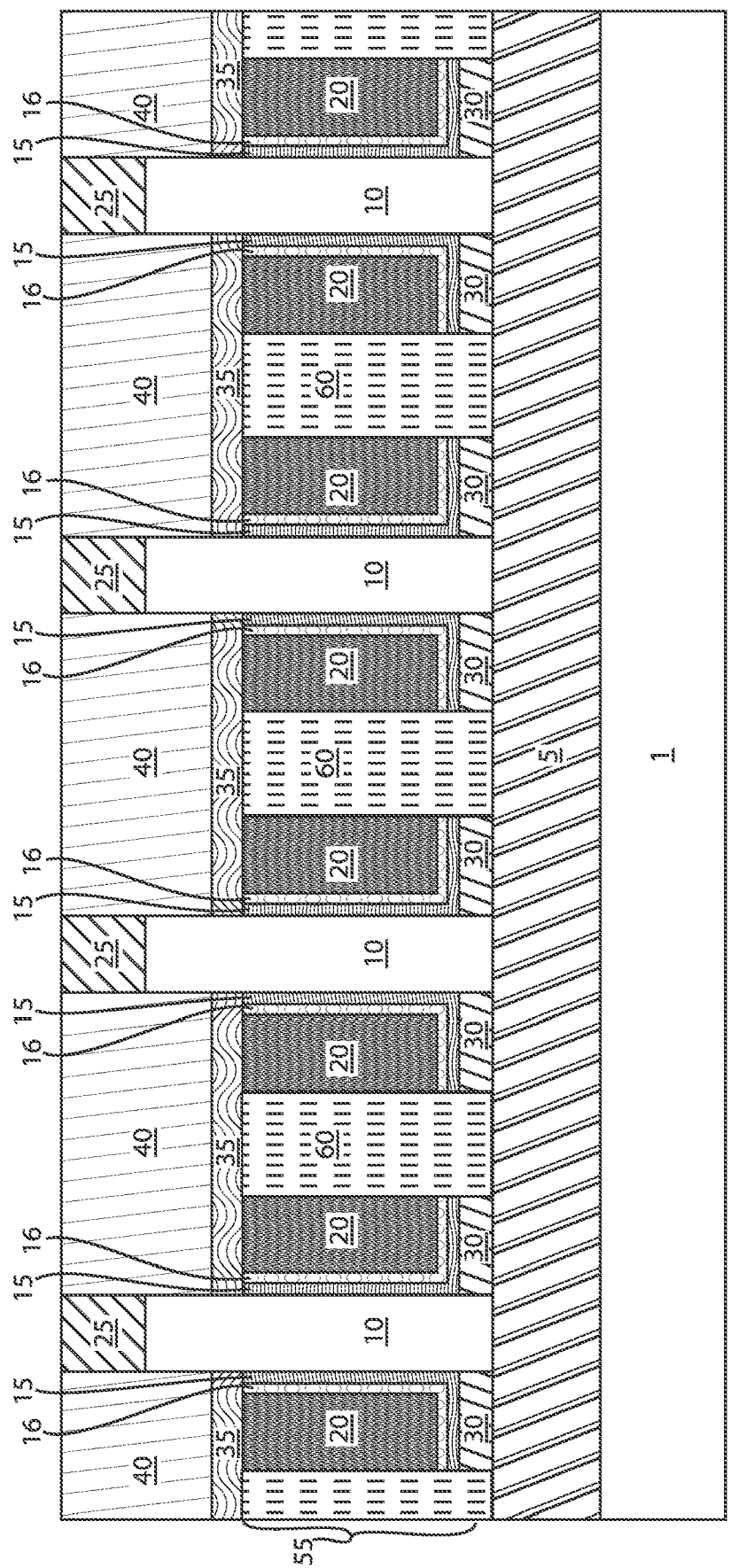
FIG. 1B is a side cross-sectional view depicting a second embodiment of a plurality of partial vertical field effect device structure for use as an initial structure for forming a doped recrystallized source/drain region, in which the fin structure is substractively formed.

FIGS. 1A and 1B depict one embodiment of a partial vertical transistor, i.e., vertical FinFET, which includes a vertically orientated channel that is positioned within a fin structure 10 composed of semiconductor material. The vertically orientated channel region that is present in the fin structure 10 is overlying a supporting substrate 1.

In the embodiment that is depicted in FIG. 1A, the fin structures 10 are substractively formed from a bulk semiconductor substrate, wherein the depth at which trenches formed in the bulk substrate provides the height of the fin structures 10, and the portion of the bulk substrate below the depth of the etched trenches provides the supporting substrate 1. Thereafter, a first source and/or drain region 5 of an epitaxial semiconductor material is formed at the base of the trenches, which is also proximate to the base of the fin structures 10.

In the embodiment that is depicted in FIG. 1B, a supporting substrate 1 provides the epitaxial deposition surface for a material stack of a first layer of epitaxial semiconductor material for the first source and drain region 5, and a second layer of epitaxial semiconductor material for the fin structures 10. The second layer of the epitaxial material for the fin structures 10 is etched using a hard mask, e.g., dielectric cap 25, in which the etch process terminates on the first layer of epitaxial semiconductor material that provides the first source and/or drain region 5. The base of each of the fin structure 10 depicted in FIG. 1B is present directly on a layer of epitaxial semiconductor material that provides the first source and drain region 5, in which the fin structure 10 is separated from the supporting substrate 1 by the epitaxial semiconductor material that provides the first source and drain region 5.

Referring to FIGS. 1A and 1B, a gate structure 55 is present around the vertically orientated channel region that is provided by the fin structure 10. The gate structure 55 may include at least one gate dielectric 15, and at least one gate conductor 20. A first dielectric spacer 30 is present between the gate structure 55 and the first source/drain region 5 that is epitaxially formed on the supporting substrate 1 at the base of the fin structure 10 that provides the vertically orientated channel region.

In some embodiments, a dielectric cap 25 (also referred to as a hardmask) is present on upper most surface of the vertically oriented channel region that is positioned with the fin structure 10. The dielectric cap 25 is present on the end of the fin structure 10 that is opposite the side, i.e., base end, of the fin structure 10 that is in direct contact with the supporting substrate 1. The dielectric cap 25 is present atop the fin structure 10 and has an upper surface that is coplanar with a dielectric stack of a second dielectric spacer 35 and an interlevel dielectric 40 (referred to below as a second interlevel dielectric layer 40).

In some embodiments, the supporting substrate 1 is composed of a type IV semiconductor material. By "type IV semiconductor" it is meant that the semiconductor material includes at least one element from Group IVA (i.e., Group 14) of the Periodic Table of Elements. Examples of type IV semiconductor materials that are suitable for the supporting substrate 5 include silicon (Si), germanium (Ge), silicon germanium (SiGe), silicon doped with carbon (Si:C), silicon germanium doped with carbon (SiGe:C) and a combination thereof. In an embodiment, the supporting substrate 1 is a single crystal silicon wafer.

Although the majority of the examples provided herein employ a type IV semiconductor substrate for the supporting substrate 1, the present disclosure is not limited to only this example. In other embodiments, the supporting substrate 1 may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the supporting substrate 5 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Referring to FIG. 1A, in some embodiments, the fin structure 10 is formed from a bulk semiconductor substrate using the hardmask 25 in combination with an etch process, or other subtractive method. Therefore, in some embodiments, the fin structure 10 has a composition that is the same as the supporting substrate 1. The above examples of semiconductor materials that are suitable for providing the supporting substrate 1, are suitable for providing examples of materials that can be used for the fin structure 10. For example, the fin structure 10 may be composed of silicon, e.g., monocrystalline silicon.

Referring to FIG. 1A, the pattern and etch processes for forming the fin structure 5 may employ a hard mask, which can provide the dielectric cap 25, atop the bulk substrate. The dielectric material may be an oxide, nitride or oxynitride material. In one example, the dielectric material that provides the hard mask, which is also referred to as the dielectric cap 25, is composed of silicon nitride. The dielectric material layer may then be patterned using photolithography, e.g., by forming a photoresist mask, and etched using an anisotropic etch process, such as reactive ion etch (RIE).

Referring to FIG. 1A, following patterning of the dielectric material layer for forming the hard mask, i.e., dielectric cap 25, bulk substrate 1 may be etched using the hard mask, i.e., dielectric cap 25 as an etch mask to define the fin structures 10, wherein the portion of the bulk substrate 1 that is underlying the fin structures 10 provides the supporting substrate 1. The height of the fin structures 10 is defined by the depth of the trenches that are etched into the bulk substrate. The etch process for defining the fin structure 10 may be an anisotropic etch process, such as reactive ion etching (RIE).

Referring to FIG. 1A, following the formation of the fin structures 10, epitaxial semiconductor material may be formed in the base of the trenches separating the adjacent fin structures 10 to provide an epitaxial semiconductor material source and/or drain region 5 that is present at the base of each of the plurality of vertically orientated channel regions. The epitaxial source and/or drain region 5 may be composed of a type IV or type III-V semiconductor. The above examples of semiconductor materials that are suitable for providing the supporting substrate 1, are suitable for providing examples of materials that can be used for the epitaxial semiconductor material source and/or drain region 5. In some embodiments, the epitaxial source and/or drain region 5 provides the source region of the device, and the later formed doped recrystallized polycrystalline semiconductor material provides the drain region of the device. In some other embodiments, the epitaxial semiconductor material source and/or drain region 5 provides the drain region of the device and the later formed doped recrystallized polycrystalline semiconductor material provides the source region of the device.

The epitaxial semiconductor material source and/or drain region 5 is typically doped to a conductivity type that provides the conductivity type of the semiconductor device. For example, if the epitaxial semiconductor material source and/or drain region 5 is doped to an n-type conductivity, the semiconductor device is an n-type device, e.g., an n-type vertical FinFET. For example, if the epitaxial semiconductor material source and/or drain region 5 is doped to a p-type conductivity, the semiconductor device is a p-type device, e.g., a p-type vertical FinFET.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on {100} crystal surface will take on {100} orientation. The epitaxial deposition process may employ a chemical vapor deposition apparatus, e.g., plasma enhanced chemical vapor deposition (PECVD), metal organic chemical vapor deposition (MOCVD). In the embodiments, in which the epitaxial semiconductor material source and/or drain region 5 is composed of an epitaxially formed silicon containing material, the silicon gas source for epitaxial deposition may be selected from the group consisting of Silane ($SiH_4$), disilane ($Si_2H_6$), or higher order silanes, hexachlorodisilane ($Si_2Cl_6$), tetrachlorosilane ($SiCl_4$), dichlorosilane ($Cl_2SiH_2$), trichlorosilane ($Cl_3SiH$), and combinations thereof.

To provide the appropriate conductivity type of the epitaxial semiconductor material source and/or drain region 5, the semiconductor material that provides the source/drain region may be doped with an n-type or p-type dopant. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous. In some embodiments, the dopant that dictates the conductivity type of the epitaxial semiconductor material source and/or drain region 5 is introduced in-situ. By "in-situ" it is meant that the dopant that dictates the conductivity type of the semiconductor material that provides the first source/drain region 5 is introduced during the process step, e.g., epitaxial deposition. The dopant for the epitaxial semiconductor material that dictates the conductivity type of the first source/drain region is typically present in a concentration ranging from $2\times10^{20}$ atoms/$cm^3$ to $2\times10^{21}$ atoms/$cm^3$.

The height of the epitaxial source and/or drain region 5 that is depicted in FIG. 1A may be adjusted using an etch process to recess the epitaxial material, as necessary.

Is other embodiments, the fin structures 10 and the epitaxial semiconductor material source and/or drain region 5 are formed from a material stack of epitaxially formed semiconductor material layer, as illustrated by the embodiment depicted in FIG. 1B. The first epitaxial semiconductor material that provides the source and/or drain region 5 for the embodiment depicted in FIG. 1B may be epitaxially formed atop a supporting substrate 1, such as a bulk semiconductor substrate. The compositions and dopants described for the epitaxial source and/or drain region 5 described with reference to FIG. 1A is suitable for describing the compositions and dopants for the epitaxial semiconductor material source and/or drain region that is depicted in FIG. 1B.

The second epitaxial semiconductor material layer that provides the fin structure 10 is epitaxially formed in direct contact with the first epitaxial semiconductor material layer that provides the epitaxial semiconductor material source and/or drain region 5. The second epitaxial semiconductor material layer that provides fin structure 10 may be composed of a type IV or type III-V semiconductor. The above examples of semiconductor materials that are suitable for providing the supporting substrate 1, are suitable for providing examples of materials that can be used for the fin structure 10. In some embodiments, when the epitaxial semiconductor material source and/or drain region 5 is composed of a crystalline semiconductor, such as a single crystal semiconductor, e.g., monocrystalline silicon (c-Si), the second epitaxially semiconductor material layer for providing the fin structure 10 will also be composed of monocrystalline silicon, and therefore the fin structure will be composed of monocrystalline silicon.

Referring to FIG. 1B, the pattern and etch processes for forming the fin structure 10 from the material stack of the first epitaxial semiconductor material layer that provides the epitaxial source and/or drain region and the second epitaxial semiconductor material layer that provides the fin structure 10 may employ a hard mask, which may be the dielectric cap 25. More specifically, after forming a blanket layer of semiconductor material for the fin structure 10 atop the first source/drain region 5, a dielectric material layer may be deposited for forming the hard mask, i.e., dielectric cap 25. The dielectric material layer may then be patterned using photolithography, e.g., by forming a photoresist mask, and etched using an anisotropic etch process, such as reactive ion etch (RIE). Following patterning of the dielectric material layer for forming the hard mask, i.e., dielectric cap 25, the second epitaxial semiconductor material layer may be etched to provide the fin structure 10. The etch process for forming the fin structure 10 may be an anisotropic etch, such as reactive ion etch (RIE).

Referring to FIGS. 1A and 1B, each of the fin structures 10 may have a height ranging from 5 nm to 200 nm. In another embodiment, each of the fin structures 10 has a height ranging from 10 nm to 100 nm. In one example, each of the fin structures 10 has a height ranging from 20 nm to 50 nm. Each of the plurality of fin structures 10 may have a width of less than 20 nm. In another embodiment, each of the fin structures 10 has a width ranging from 3 nm to 8 nm.

It is noted that the fin structures of the present disclosure are not limited to being formed by subtractive methods. For example, the fin structure 10 may be also formed using an epitaxial growth process, i.e., an additive process, atop the semiconductor material layer that provides the epitaxial source and/or drain region 5.

Referring to FIGS. 1A and 1B, a first dielectric spacer 30 may be formed atop an upper surface of the epitaxial semiconductor material source and/or drain region 5. The horizontal dielectric spacer 30 is formed by an anisotropic deposition process followed by an isotropic etch processes. The first dielectric spacer 30 may be composed of an oxide, nitride or oxynitride material. In some embodiments, the first dielectric spacer 30 is formed using anisotropic high-density plasma (HDP) deposition processes that deposits a thicker film onto horizontal surfaces and thinner film onto vertical surfaces followed by an isotropic etch process (e.g. a wet etch process) that completely removes the thinner film from the vertical surfaces. In some embodiments, the first dielectric spacer 30 may be composed of a low-k dielectric material. Examples of materials suitable for the low-k dielectric material include diamond like carbon (DLC), organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The low-k spacer material may be deposited using at least one of spin on anisotropic deposition, HDP deposition, or other deposition processes that deposit a thicker film onto horizontal surfaces.

Referring to FIGS. 1A and 1B, following formation of the first dielectric spacer 30, the gate structure 55 can be formed around the fin structure 10. The gate structure 55 includes at least one gate dielectric 15 and at least one gate conductor 20. The gate dielectric 15 of the gate structure 15, 20 is first formed on the channel portion of the fin structure 10. Typically, the gate dielectric 15 is formed using a conformal deposition process. The gate dielectric 15 may be composed of any dielectric material, such as an oxide, nitride or oxynitride material. In some embodiments, the gate dielectric is a high-k dielectric material. As used herein, "high-k" denotes a dielectric material featuring a dielectric constant (k) higher than the dielectric constant of $SiO_2$ at room temperature. For example, the least one gate dielectric layer 15 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 15 include hafnium silicate, hafnium silicon oxynitride or combinations thereof. In some embodiments, the source/drain regions 5 are made to overlap with edges of the gate structure 55, i.e. overlapping with a bottom end of the high-k gate dielectric film 55. This overlap ensures unimpeded current flow from the transistor channel located directly under the gate structure 55 and the bottom source/drain regions 5. This can be accomplished by annealing the source/drain regions 5 prior to forming gate structure 55 to outdiffuse their dopants upward past a top surface of the spacer 30.

To provide the conformal layer, the gate dielectric 15 may be deposited using atomic layer deposition (ALD). In other embodiments, the gate dielectric 15 may be deposited using chemical vapor deposition methods, such as plasma enhanced chemical vapor deposition (PECVD). In one embodiment, the thickness of the at least one gate dielectric layer 15 is greater than 0.8 nm. More typically, the at least one gate dielectric layer 15 has a thickness ranging from about 1.0 nm to about 6.0 nm. In some embodiments, conformal deposition of the gate dielectric 15 produces a vertical portion on the channel portion of the fin structure 10, and a horizontal portion that is present on the upper surfaces of the first dielectric spacer 30.

Following formation of the gate dielectric 15, a work function metal 16 may be deposited. The work function metal 16 may be selected to provide a p-type work function metal layer and an n-type work function metal layer. In one embodiment, the p-type work function metal layer is composed of titanium nitride (TiN). The p-type work function metal layer may also be composed of TiAlN, Ru, Pt, Mo, Co and alloys and combinations thereof. In one embodiment, the n-type work function metal layer is composed of at least one of TiAl, TaN, TiN, HfN, HfSi, or combinations thereof. It is noted that the work function metal is optional and may be omitted. The gate conductor 20 may be blanket deposited over the work function metal 16, as well as over the gate dielectric 15, or directly on the gate dielectric 15 when the work function metal is not present. In various embodiments, the gate conductor 20 is a metal, where the metal may be tungsten (W), tungsten nitride (WN) or combinations thereof. In one or more embodiments, the gate conductor 20 is tungsten (W). The gate conductor 20 may be deposited by CVD or PECVD or PVD. Following their deposition, the material layers that provide the gate structure 50 may be patterned and etched to provide the geometry of the gate structure 50 that is depicted in FIGS. 1A and 1B.

Referring to FIGS. 1A and 1B, in some embodiments, a second dielectric spacer 35 is present on an upper surface of the gate structure 50. The second dielectric spacer 35 may be composed of an oxide, nitride or oxynitride material. In some embodiments, the second dielectric spacer 35 is composed of silicon nitride formed using chemical vapor deposition (CVD), e.g., plasma enhanced chemical vapor deposition (PECVD). In some embodiments, the second dielectric spacer 35 may be composed of a low-k dielectric material. It noted that any of the low-k dielectric materials that are described above for the first dielectric spacer 30 are suitable for describing the second dielectric spacer 30.

In addition to being atop the upper surface the gate structure 50, the second dielectric spacer 35 may be present atop a first interlevel dielectric layer that is separating adjacent gate structures that present on adjacent fin structures 10 in the plurality of fin structures depicted in FIGS. 1A and 1B. The first interlevel dielectric layer (ILD) 60 may be composed of any dielectric material, such as an oxide, nitride or oxynitride material. A second interlevel dielectric layer (ILD) 40 may be present atop the second spacer 35 and the hard mask 25. Similar to the first interlevel dielectric layers 40, the second interlevel dielectric layer (ILD) 60 may be composed of any dielectric material, such as an oxide, nitride or oxynitride material.

It is noted that although FIGS. 2-8 illustrate a process flow using the initial structure depicted in FIG. 1A, the initial structure depicted in FIG. 1B is equally applicable to the process flow that is described below with reference to FIGS. 2-8.

Figure 2:
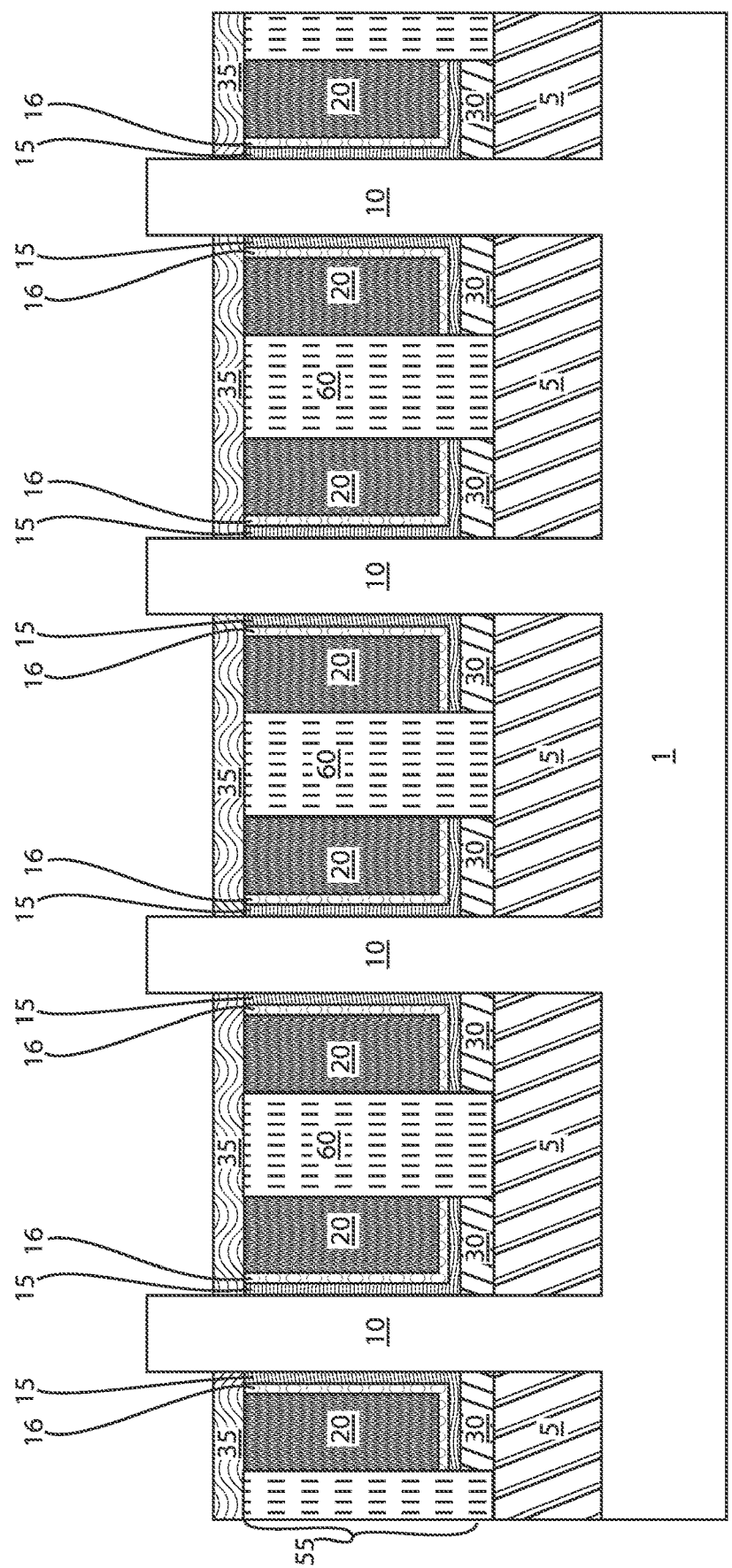
FIG. 2 is as side cross-sectional view depicting removing an interlevel dielectric layer and a hardmask from the structure depicted in FIG. 1 to expose the upper surface of the semiconductor fin structure that provides the vertically orientated channel of the device.

FIG. 2 depicts one embodiment of removing the hardmask 25 and the second interlevel dielectric layer 40 to expose the upper surface of the semiconductor fin structure 10 that provides the vertically orientated channel of the device. The hardmask 25 and the second interlevel dielectric layer 40 may be removed by a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The hardmask 25 and the second interlevel dielectric layer 40 may be removed using a wet or dry etch process. In one embodiment, the hardmask 25 and the second interlevel dielectric layer 40 is removed by reactive ion etch (RIE).

Figure 3:
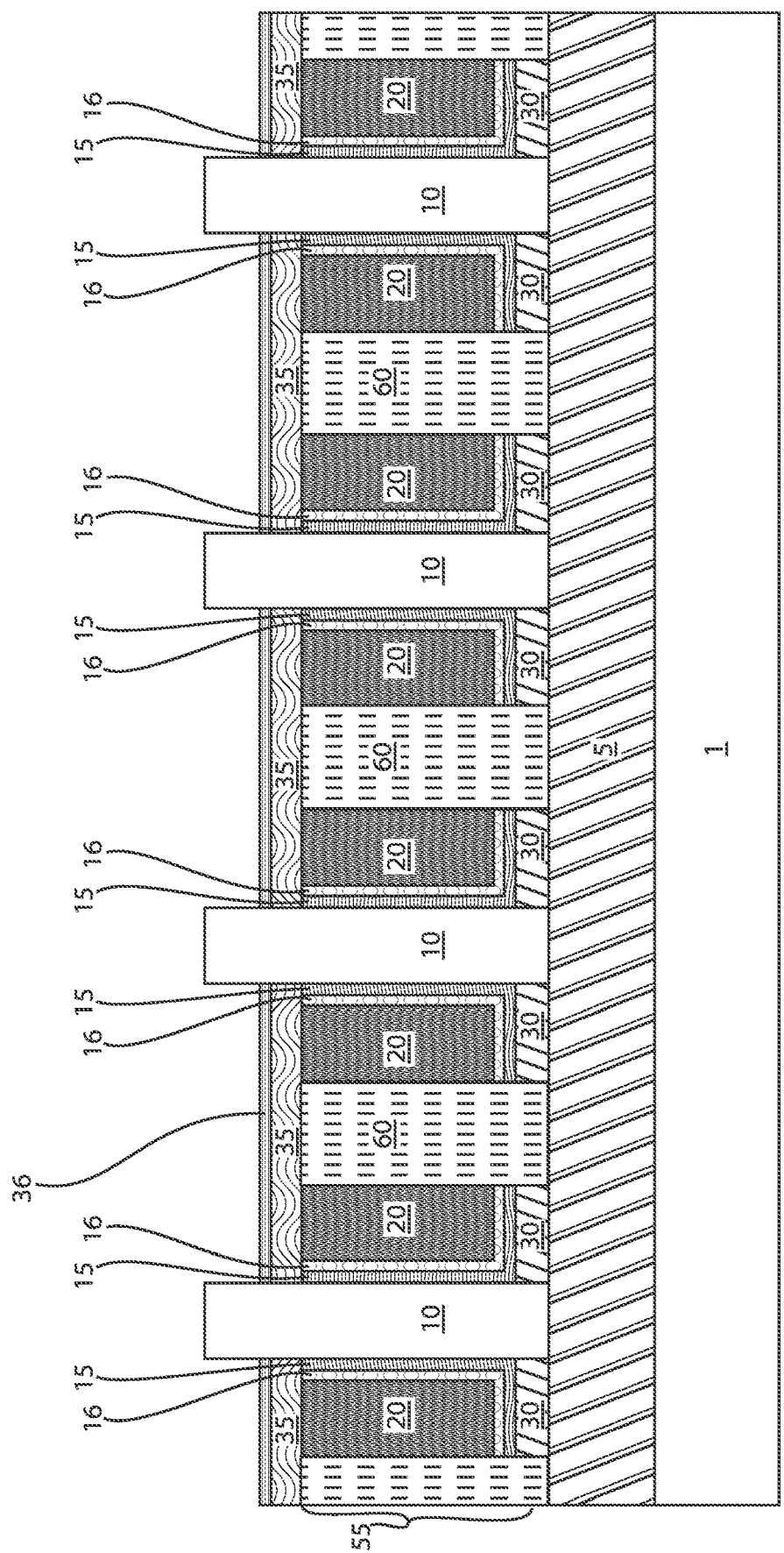
FIG. 3 is a side cross-sectional view depicting one embodiment of a surface nitridation process applied to the upper spacer of the structure depicted in FIG. 2.

FIG. 3 depicts one embodiment of a surface nitridation process applied to the upper spacer 35 of the structure depicted in FIG. 2, which forms a surface nitride layer 36. In some embodiments, the surface nitridation process seasons the upper spacer 35 to make it more wettable to liquid silicon, silicon germanium, or germanium. For example, if the material of the top spacer 35 is an oxide, such as silicon oxide ($SiO_2$), a surface nitridation process may be employed to make the oxide surface more wettable to liquid silicon, silicon germanium, or germanium during the liquid phase epitaxial re-growth processed enabled by nanosecond-scale laser annealing. In some embodiments, the amount of nitrogen in the surface layer 36 can be varied to adjust wettability to specific material of the subsequently formed doped amorphous semiconductor material 65, e.g., the amount of nitrogen may be adjusted to increases wettability taking into account the specific germanium (Ge) concentration for the subsequently formed doped amorphous semiconductor material 65. For instance, a surface nitride layer 36 that is a pure silicon nitride surface can be suitable for liquid silicon (liquid silicon wets silicon nitride), but would be somewhat detrimental to a surface nitride layer 36 that is composed of pure germanium (Ge), because liquid germanium (Ge) has less wettability on pure silicon nitride surfaces. Vice versa, pure silicon oxide ($SiO_2$) surface will be detrimental to liquid silicon (Si), but can be somewhat favorable to pure liquid germanium (Ge). Surface nitridation may be accomplished using a nitrogen containing thermal process, e.g., thermal growth; a nitrogen containing plasma process, e.g., microwave-excited high-density plasma of nitrogen containing gas; and/or a nitrogen containing radical treatment. In some examples, the surface nitridation process may include exposure of the top spacer 36 to ammonia or ammonia containing elements. In some embodiments, the surface nitridation process is performed at a process temperature of less than 500° C. In some embodiment, surface nitridation at low temperatures can employ hydrazine ($H_2NNH_2$), which can be used as a low temperature thermal atomic layer deposition (ALD) nitride source. It is noted that the surface nitridation process depicted in FIG. 3 is optional. The surface nitridation process may be omitted.

Figure 4:
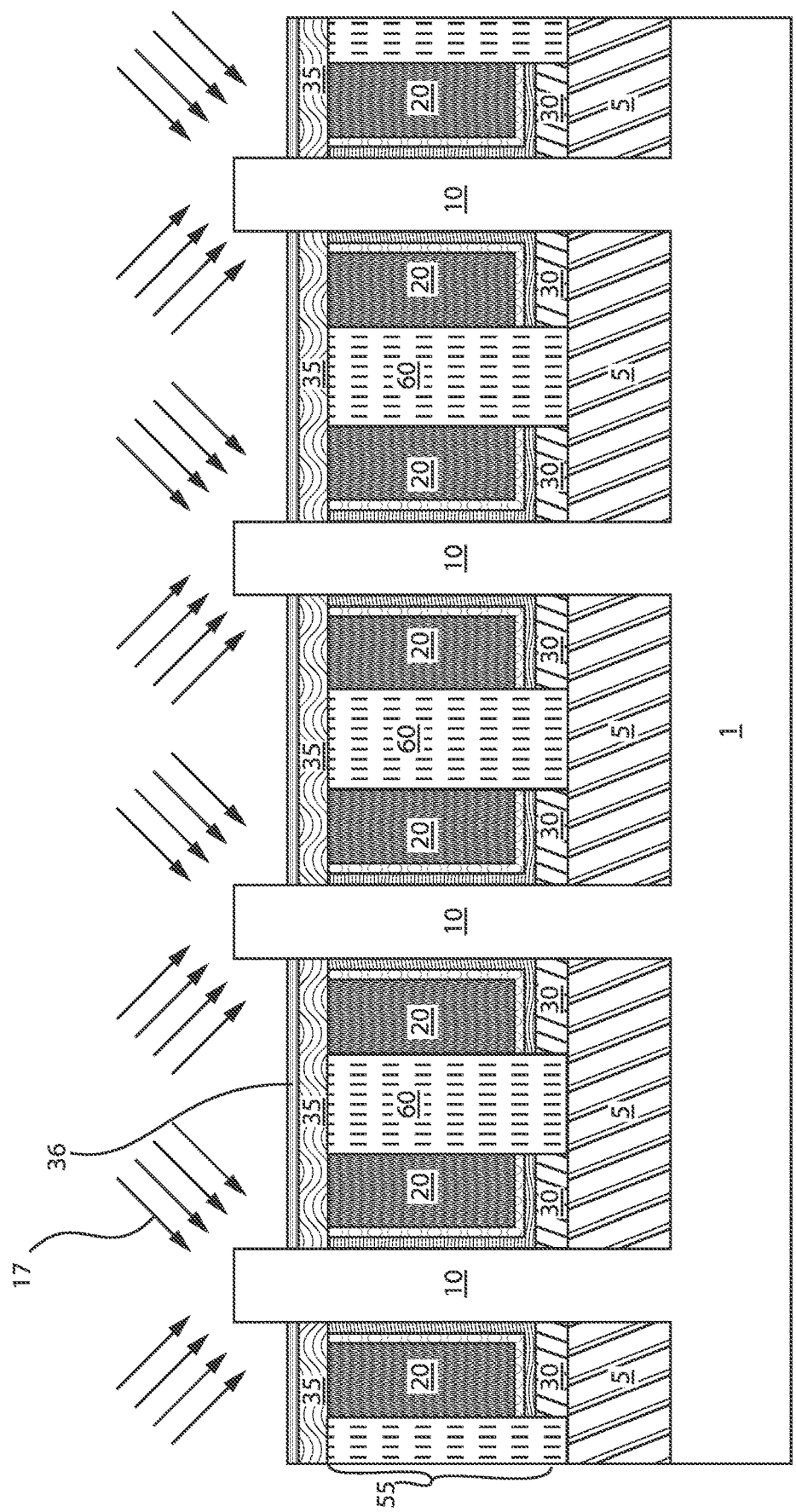
FIG. 4 is a side cross-sectional view depicting one embodiment of ion implantation of the upper surface of the semiconductor fin structure with an n-type or p-type dopant.

FIG. 4 depicts one embodiment of ion implantation of the upper surface of the semiconductor fin structure with an n-type or p-type dopant. Ion implantation typically includes use of an ion source, where ions of the desired element are produced; the use of an accelerator, where the ions are electrostatically accelerated to a high energy, and the use of a target chamber, where the ions impinge on a target, which is the material to be implanted. The ion implanted n-type or p-type dopant provides a source/drain extension region. For example, the ions 17 may comprise n-type dopant for type IV semiconductor materials, e.g., arsenic, phosphorus, or antimony, and can be implanted at energies in the range of about 0.5 keV to about 30 keV and at a dose of about $1\times10^{14}$ $cm^{-2}$ to about $1\times10^{16}$ $cm^{-2}$ to form the source/drain extension of an n-channel vertical transistor. Similarly, for a P-channel vertical transistor, the ions 17 may comprise a p-type dopant for type IV semiconductor materials, e.g., boron, gallium, or indium, implanted at a suitable energy and dose for forming the pFET source/drain extension. In some embodiments, the top source/drain extension regions are made to overlap with the edges of the gate structure 55, i.e. overlapping with a top end of the high-k gate dielectric film 15. The overlap ensures unimpeded current flow from the transistor channel located directly under the gate structure 55 and the top source/drain extension regions. This can be accomplished by implanting the top source/drain extension regions with respective n-type and p-type dopants at a sufficient implantation energy such that the dopants pass beyond the bottom surface of the spacer 35 to form a p-n junction below the spacer 35. Advantageously, the implantation can be conducted at an elevated temperature of from 200° C. to 450° C. to avoid any amorphization of the fins 10 by implanted ions.

Figure 5:
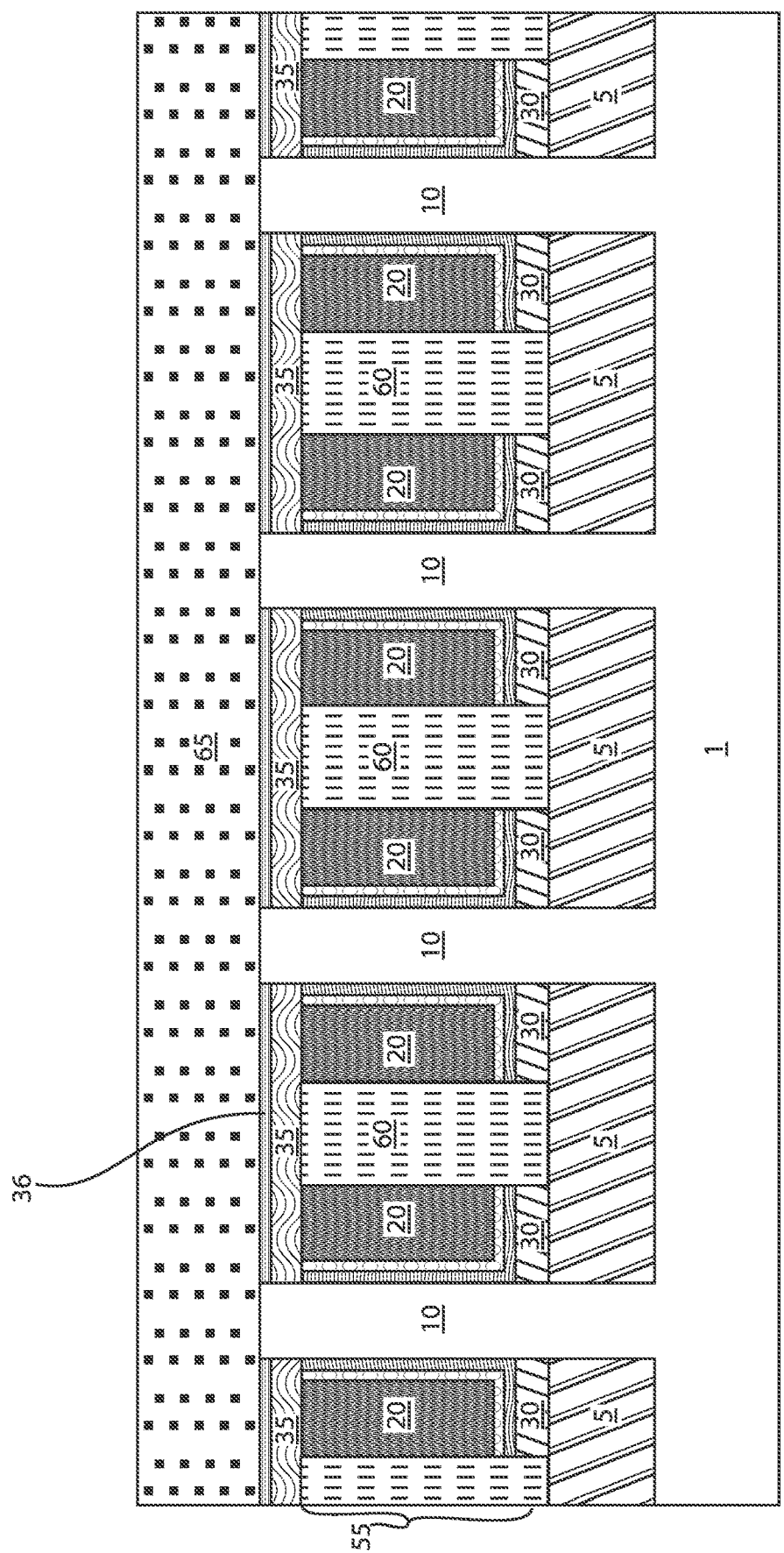
FIG. 5 is a side cross-sectional view depicting one embodiment of depositing a doped amorphous semiconductor material on an upper surface of the semiconductor fin structure that is opposite a base surface of the semiconductor fin structure that is in contact with the supporting substrate.

FIG. 5 depicts one embodiment of depositing a doped amorphous semiconductor material 65 on an upper surface of the semiconductor fin structure 10 that is opposite a base surface of the semiconductor fin structure 10 that is in contact with the supporting substrate 1. The term "amorphous" denotes that the non-crystalline solid is a solid that lacks the long-range order characteristic of a crystal. In some embodiments, before forming the doped amorphous semiconductor 65, the upper surface of the structure depicted in FIG. 4 is cleaned with a chemical cleaning composition, which will aid the adhesion of the doped amorphous semiconductor material 65.

In some embodiments, the doped amorphous semiconductor 65 is deposited into contact with the upper surface of at least one semiconductor fin structure 10 using a physical vapor deposition (PVD) method. In some embodiments, the doped amorphous semiconductor 65 is deposited into contact with the upper surface a plurality of semiconductor fin structures 10. Physical vapor deposition (PVD) is a deposition process characterized by a process in which the material goes from a condensed phase to a vapor phase and then back to a thin film condensed phase. In some embodiments, the physical vapor deposition (PVD) method for forming the doped amorphous semiconductor 65 is sputtering. As used herein, "sputtering" means a method of depositing a film of material on a semiconductor surface. A target of the desired material, i.e., source, is bombarded with particles, e.g., ions, which knock atoms from the target, and the dislodged target material deposits on the deposition surface. Examples of sputtering techniques suitable for depositing the doped amorphous semiconductor 65 include, but are not limited too, DC diode sputtering ("also referred to as DC sputtering"), radio frequency (RF) sputtering, magnetron sputtering, and ionized metal plasma (IMP) sputtering.

In some embodiments, depositing the doped amorphous semiconductor material 65 comprises physical vapor deposition (PVD) of a composition selected from the group consisting of amorphous silicon (α-Si), amorphous silicon germanium (α-SiGe), amorphous germanium (α-Ge), and combinations thereof. It is noted that theses semiconductor compositions are provided for illustrative purposes only and are not intended to limit the present disclosure, as other semiconductor composition are equally applicable.

The doped amorphous semiconductor material 65 is typically doped with an n-type or p-type dopant. As will be further discussed below, the doped amorphous semiconductor material 65 is recrystallized to provide a source and/or drain region for the vertical transistor. Therefore, the conductivity type dopant, i.e., whether the dopant is p-type or n-type, may be selected to match the conductivity type of the epitaxial semiconductor material source and/or drain region 5 at the opposing end, i.e., base end, on the fin structure 10 that provides the vertically orientated channel. The dopant may be introduced to the doped amorphous semiconductor material using insitu doping. In the case of sputtering, the dopant, i.e., n-type and/or p-type dopant, that dictates the conductivity type of the doped amorphous semiconductor material 65, as well as the subsequently formed recrystallized source and/or drain region for the vertical transistor, may be integrated into the sputtering target from which the sputtered material is deposited onto upper surface a plurality of semiconductor fin structures 10. In some embodiments, the conductivity type dopant, i.e., n-type and/or p-type dopant, is a dopant selected from the group consisting of boron (B), arsenic (As), phosphorus (P), gallium (Ga), antimony (Sb) and combinations thereof. In some embodiments, the n-type or p-type dopant is selected to provide a contact resistance improving dopant, such as gallium (Ga), antimony (Sb) or a combination thereof. Antimony (Sb) is an n-type dopant in a type IV semiconductor, such as silicon (Si). Gallium (Ga) is a p-type dopant in type IV semiconductor, such as silicon (Si). The dopant that dictates whether the doped amorphous semiconductor material 65, as well as the subsequently formed recrystallized source and/or drain region for the vertical transistor, is n-type and/or p-type may be present in a concentration ranging from $1\times10^{19}$ atom/cm$^3$ to $1\times10^{22}$ atoms/cm$^3$.

In one example, the doped amorphous semiconductor material 65 is amorphous germanium.

In some embodiments, the doped amorphous semiconductor material 65 may be planarized to provide a planar upper surface. In some example, the doped amorphous semiconductor material 65 may be planarized using chemical mechanical planarization (CMP).

Figure 6:
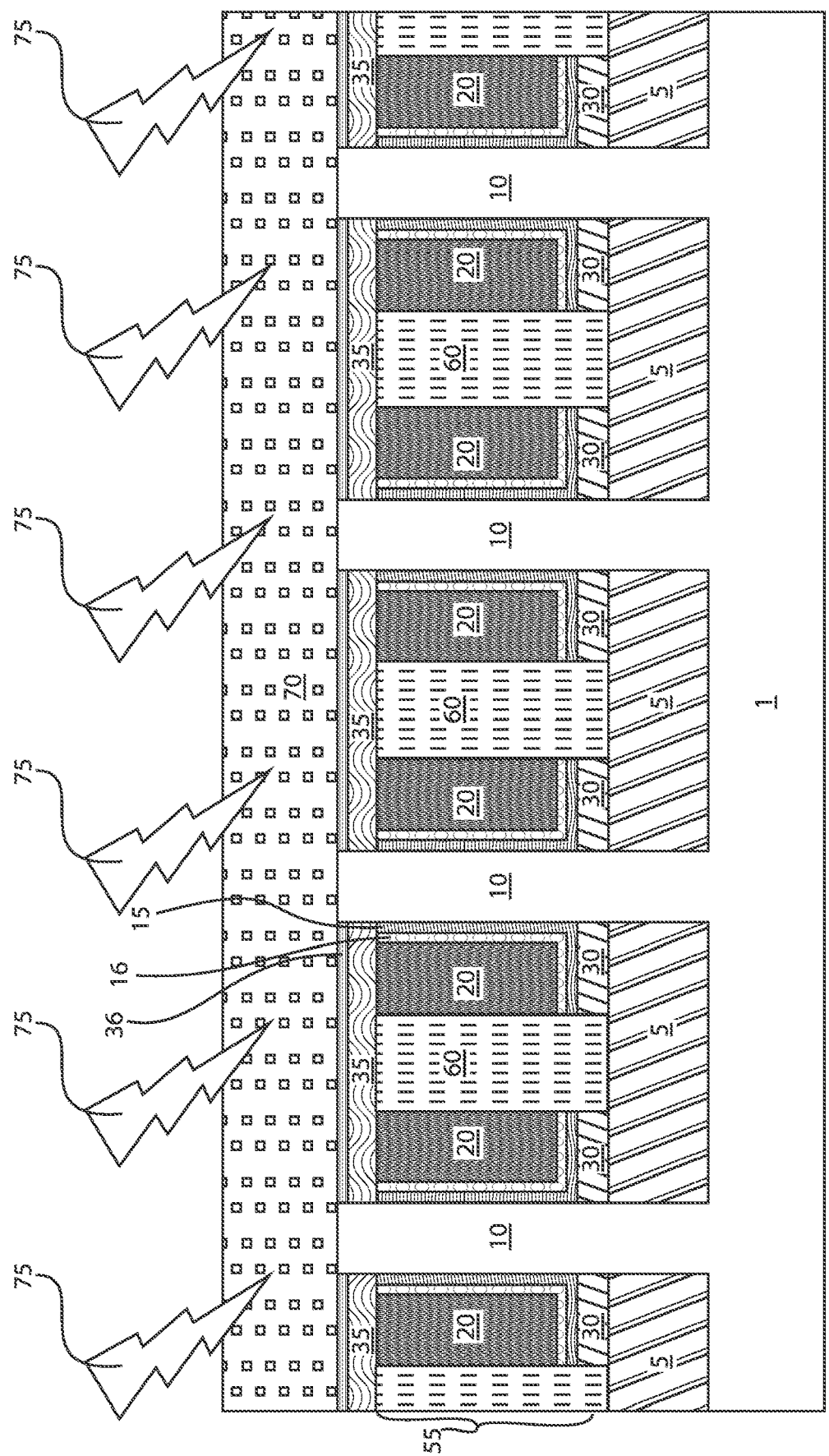
FIG. 6 is a side cross-sectional view depicting recrystallizing the doped amorphous semiconductor material with an anneal duration for substantially a millisecond duration or less to provide a doped polycrystalline source and/or drain region at the upper surface of the semiconductor fin structure.

FIG. 6 depicts recrystallizing the doped amorphous semiconductor material 65 with an anneal duration for substantially a millisecond duration or less to provide a doped polycrystalline source and/or drain region 70 at the upper surface of the semiconductor fin structure 10. The recrystallization converts the amorphous material, i.e., the doped amorphous semiconductor material 65, to a crystalline material for the source and/or drain region 70 at the upper surface of the semiconductor fin structure 10. The term "crystalline" includes single crystal and polycrystalline crystal structures. The term "single crystalline" denotes a crystalline solid, in which the crystal lattice of the entire sample is substantially continuous and substantially unbroken to the edges of the sample, with substantially no grain boundaries. Contrary to a single crystal crystalline structure, a polycrystalline structure is a form of semiconductor material made up of randomly oriented crystallites.

The thermal budget of the recrystallization process is sufficiently low that it does not impact the gate structure, i.e., preserving its integrity, shifting transistor threshold voltages by no more than 30 millivolts, and thickening gate dielectric by no more than 0.25 Angstrom.

In some embodiments, a laser anneal process 75 may be applied to the structure to recrystallize, or melt and recrystallize, the doped amorphous semiconductor material 65 to form doped recrystallized crystalline semiconductor material 70, such as a large-grain polycrystalline semiconductor material, on an upper end of the fin structure 10 that is opposite the base end of the fin structure 10 provides a source and/or drain region.

As used herein, the term "laser annealing" denotes an annealing method that employs a laser to induce heat in the surface being treated. A laser is an electronic-optical device that emits coherent radiation. In some embodiments, a typical laser emits light in a narrow, low-divergence beam and with a defined wavelength. In some instances, the advantages of employing laser for annealing processes is that its light can be easily shaped and focused onto a specific area of the substrate achieving very high radiation intensity with short exposure durations. This can provide for a localized substrate heating to a target high temperature with very short durations. In some embodiments, the short exposure duration is achieved by raster scanning focused laser beam over the substrate surface. In this case, the exposure duration measured at half of the incident intensity is the beam width in the scanning direction divided by the scanning velocity. In alternative embodiments, the short exposure duration is achieved by employing a pulsed laser. In this case, the laser beam is shaped to achieve a required peak intensity over a selected substrate area such as over an entire product die and the laser is operated in a pulsed mode such as in the case of Q-switched laser. The pulse duration of Q-switched laser at half of the peak intensity determines the substrate exposure time. The exposure process is repeated for all product dies on the wafer surface in a step-and-repeat approach. Once the substrate surface is exposed to the laser radiation either through raster scanning or through a laser pulse, its surface temperature begins raising from its base value and falls shortly after the exposure creating a triangular temperature profile with shorter durations near the temperature peak and longer duration near the temperature base. While it is customary to measure the anneal duration at 50° C. below the peak temperature, it is easier to specify the process duration in terms of exposure time for ultra short anneals, i.e. for millisecond- and nanosecond-scale anneals. In some embodiments, the anneal duration at 50° C. below the peak temperature is a fraction (e.g. about ⅓) of exposure time, such that if exposure time is 1 millisecond, the anneal duration at 50° C. below the peak temperature is about 330 microseconds. The laser wavelength is selected to couple its beam into amorphous material 65 and/or substrate 1 and to minimize any contrast or pattern effects that may exist due to the presence of dissimilar microstructures on the substrate surface. In some embodiments, longer laser wavelength (e.g. longer than 500 nm) may be employed to minimize contrast or pattern effects and shorter laser wavelength (e.g. shorter than 1100 nm) may be employed to improve coupling into and absorption by amorphous material 65 and/or substrate 1. Selecting laser wavelength substantially larger (e.g. 20 times larger) than a characteristic dimension of microstructures (e.g. a microstructure pitch) results a more homogeneous radiation coupling into and absorption by such microstructure system reducing contrast or pattern effects. Selecting laser wavelength shorter than the band gap absorption edge of amorphous material 65 and/or substrate 1 allows for an efficient absorption of radiation by these materials. The bang gap absorption edge for silicon is 1100 nm. In some embodiments, the laser type with longer emitting wavelength that is employed in the laser annealing method is selected from a far-infrared $CO_2$ laser emitting at 10600 nm, a solid-state Nd:YAG laser emitting at 1064 nm, or a solid-state laser diode array emitting in a 780 nm-1000 nm band. In some embodiments, the laser type with shorter emitting wavelength that is employed in the laser annealing method is selected from an excimer laser emitting at below 400 nm, a frequency-doubled or -tripled solid-state Nd:YAG laser emitting at 532 nm or 355 nm, respectively, or a solid-state laser diode array emitting at below 1000 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds (ArF (193 nm), KrCl (222 nm), KrF (248 nm), XeCl (308 nm), and XeF (351 nm)). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation. Some examples of laser annealing systems that can produce the anneal temperatures and millisecond scale anneal durations that are suitable for converting, e.g., recrystallizing, the doped amorphous semiconductor material 65 into doped recrystallized crystalline semiconductor material 70 include commercially available Laser Spike Annealing (LSA™) based on scanning far-infrared $CO_2$ laser emitting at 10600 nm with an optional second scanning beam based on solid-state laser diode array emitting in a 780 nm-1000 nm or Dynamic Surface Annealing (DSA™) based on scanning on solid-state laser diode array emitting in a 780 nm-1000 nm, and combinations thereof. Additionally, millisecond-scale flash annealing may also be employed for converting, e.g., recrystallizing, the doped amorphous semiconductor material 65 into doped recrystallized crystalline semiconductor material 70. Some examples of laser annealing systems that can produce the anneal temperatures and nanosecond-scale anneal durations that are suitable for converting, e.g., melting and recrystallizing, the doped amorphous semiconductor material 65 into doped recrystallized crystalline semiconductor material 70 include commercially available nanosecond laser melting systems based on Q-switched solid-state Nd:YAG lasers or XeCl excimer lasers or dual-beam laser melting systems based on a $1^{st}$ scanning laser beam with nanosecond-scale substrate exposure based on continuous-wave solid-state Nd:YAG lasers and a 2nd scanning laser beam with millisecond-scale substrate exposure based on continuous-wave solid-state laser diode arrays emitting in a 780 nm-1000 nm.

In some examples, doped amorphous semiconductor material 65 composed of germanium (Ge) recrystallizes via a solid phase epitaxial re-growth (SPE) at annealing temperatures ranging from 650° C. to 800° C. with an millisecond-scale (msec) duration anneal. Once recrystallized, the melting point of polycrystalline Ge layer 70 is about 940° C. Advantageously, the doped amorphous semiconductor material 65 can be annealed or laser-scanned several times (two times, three times, etc.) to ensure complete recrystallization and without any detriment to the resultant polycrystalline Ge layer 70. In some examples, doped amorphous semiconductor material 65 composed of germanium (Ge) recrystallizes via a liquid phase epitaxial re-growth (LPE) by first directly melting amorphous material 65 and then recrystallizing liquid Ge. Doped amorphous semiconductor material 65 composed of germanium (Ge) directly melts at around 700° C. in nanosecond anneal, or about 200 C lower than the melting point of crystalline Ge. Ultra-short duration of nanosecond anneal prevents solid phase epitaxial re-growth and converts amorphous material 65 directly into the liquid state at around 700° C. Once recrystallized, the melting point of polycrystalline Ge layer 70 is about 940° C. Advantageously, the doped amorphous semiconductor material 65 can be liquefied throughout in one nano-second laser exposure ensuring a uniform re-growth. Due to this, step-and-repeat laser annealing system are preferred. Exposed crystalline surface of fins 10 provide crystallization seeds for both SPE and LPE re-growth. In the case of LPE, top spacer surface 36 is selected to ensure wettability to the molten semiconducting material 65 preventing the formation of droplets. In some examples, doped amorphous semiconductor material 65 composed of silicon (Si) recrystallizes via at annealing temperatures ranging from 900° C. to 1200° C. with an millisecond-scale (msec) duration anneal, and doped amorphous semiconductor material 65 composed of silicon (Si) melts at around 1200° C. in nanosecond anneal. Once recrystallized, the melting point of doped polycrystalline Si layer 70 is about 1400° C. A doped amorphous semiconductor material 65 composed of silicon germanium (SiGe) depending on germanium (Ge) concentration has recrystallization and melt temperature characteristics between those parameters of substantially pure silicon (Si) and substantially pure germanium (Ge), wherein with the higher the germanium (Ge) content in the silicon germanium (SiGe) the lower the recrystallization thermal budget.

In one embodiment, the anneal temperature to recrystallize, or melt and recrystallize, the doped amorphous semiconductor material 65 to form doped recrystallized crystalline semiconductor material 70 ranges from 650° C. to 1200° C. In other examples, the anneal temperature recrystallize, or melt and recrystallize, the doped amorphous semiconductor material 65 to form doped recrystallized crystalline semiconductor material 70 is equal to 650° C., 700° C., 750° C., 800° C., 850° C., 900° C., 950° C., 1000° C., 1050° C., 1100° C., 1150° C., and 1200° C., as well as any range having an upper limit and a lower limit provided by one of the aforementioned examples.

In one embodiment, the doped recrystallized crystalline semiconductor material 70 is polycrystalline material, such as polysilicon. In one embodiment, the recrystallized polycrystalline semiconductor material 70 is polycrystalline silicon doped with antimony (Sb). In another embodiment, the recrystallized polycrystalline semiconductor material 70 is polycrystalline silicon doped with gallium (Ga). It is noted that the dopant that dictates the conductivity type of the doped recrystallized crystalline semiconductor material 70 may be any n-type or p-type dopant, e.g., boron (B), arsenic (As), phosphorus (P) and combinations thereof. In some embodiments, the dopant that dictates the conductivity type of the doped recrystallized crystalline semiconductor material 70, i.e., n-type and/or p-type conductivity type, may be present in a concentration ranging from $1 \times 10^{19}$ atom/cm$^3$ to $1 \times 10^{22}$ atoms/cm$^3$.

In some embodiments, the recrystallized polycrystalline semiconductor material 70 provides a doped polycrystalline source and/or drain region that has a planar upper surface and provides a merging structure between adjacent fin structures 10. The planar upper surface of the doped polycrystalline source and/or drain region provides a large surface area when compared to the facetted, i.e., peaked, upper surface of diamond shaped epitaxial material. The doped polycrystalline source and/or drain region is free of diamond shaped geometries and/or upper surfaces that are peaked.

Figure 7:
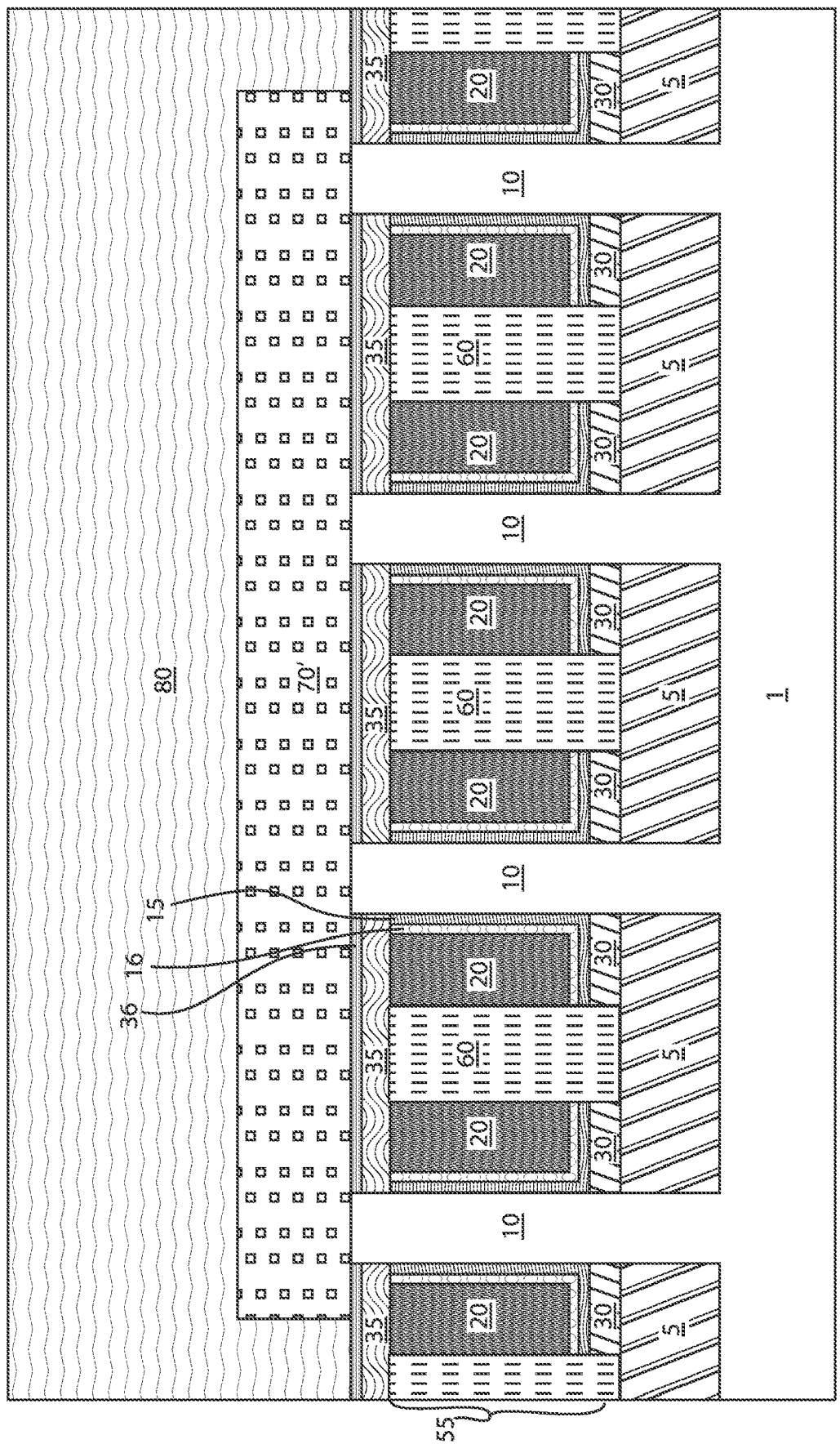
FIG. 7 is a side cross-sectional view depicting forming an interlevel dielectric layer on the structure depicted in FIG. 6.

FIG. 7 depicts forming an interlevel dielectric layer 80 on the doped recrystallized crystalline semiconductor material 70 that is depicted in FIG. 6. In some embodiments, the doped recrystallized crystalline semiconductor material 70' is patterned and etched to be in contact with substantially only the desires upper surfaces of the desired fin structures. Thereafter, an interlevel dielectric layer 80 is deposited. The interlevel dielectric layer 80 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

Figure 8:
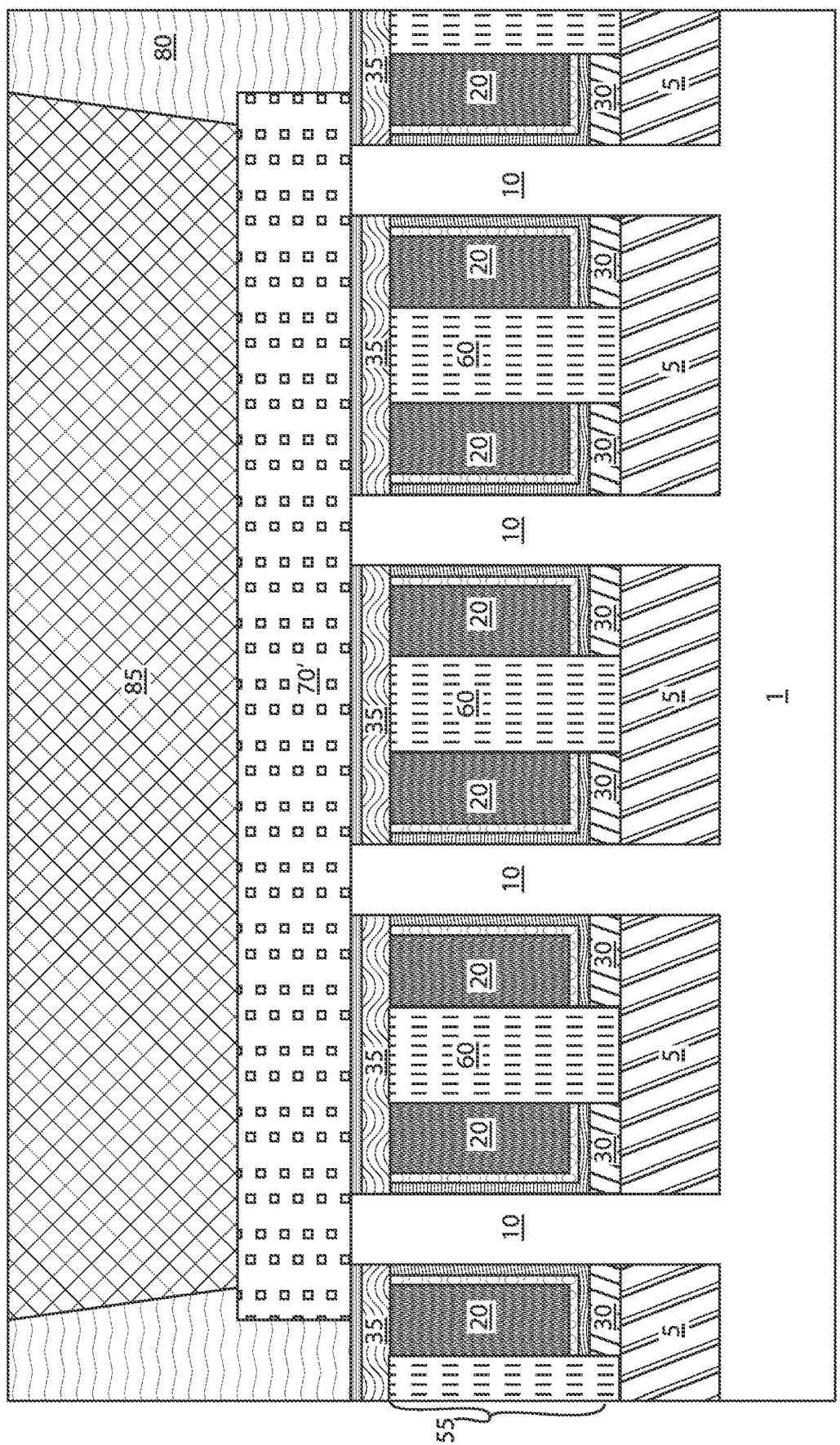
FIG. 8 is a side cross-sectional view depicting forming a contact through the interlevel dielectric layer to the planar upper surface of the doped polycrystalline source and/or drain region at the upper surface of the semiconductor fin structure.

FIG. 8 depicts forming a contact 85 through the interlevel dielectric layer 80 to the planar upper surface of the doped polycrystalline source and/or drain region 70' at the upper surface of the semiconductor fin structure 10. The contact 85 may be formed by forming an opening using photolithography and etching to expose the planar upper surface of the doped polycrystalline source and/or drain region 70' and depositing a conductive metal into the via opening using deposition methods, such as CVD, sputtering or plating. The conductive metal may include, but is not limited to titanium, titanium nitride, tantalum, tantalum nitride, tungsten, cobalt, ruthenium, copper, aluminum, silver, gold and alloys and combinations thereof.

In some embodiments, the method described with reference to FIGS. 1-8 can provide a semiconductor device, i.e., vertical transport field effect transistor (VTFET), that includes a vertically orientated channel region present within a fin structure 10 having a base end overlying a supporting substrate 1. An epitaxial semiconductor material present at the base end of the fin structure that provides a first source/drain region 5, i.e., epitaxial source and/or drain region 5. A recrystallized polycrystalline semiconductor material 70' having a planar upper surface that is present on an upper end of the fin structure that is opposite the base end of the fin structure 10 provides a second source/drain region. In one example, the recrystallized polycrystalline semiconductor material 70' is polycrystalline silicon doped with antimony (Sb). In another example, the recrystallized polycrystalline semiconductor material 70' is polycrystalline silicon doped with gallium (Ga).

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a LOW THERMAL BUDGET TOP SOURCE AND DRAIN REGION FORMATION FOR VERTICAL TRANSISTORS (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
a vertically orientated channel region present within a fin structure having a base end in contact with a supporting substrate;
an epitaxial semiconductor material present at the base end of the fin structure that provides a first source/drain region; and
a recrystallized polycrystalline semiconductor material having a planar upper surface that is present on an upper end of the fin structure that is opposite the base end of the fin structure provides a second source/drain region.

2. The semiconductor device of claim 1, wherein the recrystallized polycrystalline semiconductor material is polycrystalline silicon doped with antimony (Sb).

3. The semiconductor device of claim 1, wherein the recrystallized polycrystalline semiconductor material is polycrystalline silicon doped with gallium (Ga).

4. The semiconductor device of claim 3, further comprising a gate structure including a gate dielectric on the vertically orientated channel region of the fin structure.

5. The semiconductor device of claim 3, wherein the gate structure further comprises a gate conductor present on the gate dielectric.

6. The semiconductor device of claim 1, wherein the recrystallized polycrystalline semiconductor material has a planar upper surface and provides a merging structure between the fin structure and an adjacent fin structure of an adjacent semiconductor device.

7. The semiconductor device of claim 1, wherein a first dielectric spacer is in direct contact with a top surface of the first source/drain region.

8. The semiconductor device of claim 7, wherein a second dielectric spacer is in direct contact with a gate conductor of a gate structure.

9. The semiconductor device of claim 8, wherein the first and second dielectric spacers directly contact a sidewall of the fin structure.

10. The semiconductor device of claim 9, wherein a surface nitride layer is disposed between the second dielectric spacer and the second source/drain region.

11. The semiconductor device of claim 10, wherein the first dielectric spacer has a first size and the second dielectric spacer has a second size, where the second size is greater than the first size.

12. The semiconductor device of claim 11, wherein an interlayer dielectric (ILD) of the gate structure directly contacts both the first and second dielectric spacers.

13. A semiconductor device comprising:
a vertically orientated channel region present within a fin structure having a base end in contact with a supporting substrate;
an epitaxial semiconductor material present at the base end of the fin structure that provides a first source/drain region;
a recrystallized polycrystalline semiconductor material having a planar upper surface that is present on an upper end of the fin structure that is opposite the base end of the fin structure provides a second source/drain region;
a first dielectric spacer directly contacting the first source/drain region; and
a second dielectric spacer directly contacting the second source/drain region.

14. The semiconductor device of claim 13, wherein the first dielectric spacer directly contacts a portion of a top surface of the first source/drain region.

15. The semiconductor device of claim 14, wherein the second dielectric spacer is in direct contact with a portion of a top surface of a gate conductor of a gate structure.

16. The semiconductor device of claim 13, wherein the first and second dielectric spacers directly contact a sidewall of the fin structure.

17. The semiconductor device of claim 13, wherein a surface nitride layer is disposed between the second dielectric spacer and the second source/drain region.

18. The semiconductor device of claim 13, wherein the first dielectric spacer has a first size and the second dielectric spacer has a second size, where the second size is greater than the first size.

19. The semiconductor device of claim 13, wherein an interlayer dielectric (ILD) of a gate structure directly contacts both the first and second dielectric spacers.

20. The semiconductor device of claim 13, wherein the second source/drain region is a continuous region and the first source/drain region includes segmented sections.

* * * * *